US012267078B2

(12) United States Patent
Quartiroli et al.

(10) Patent No.: US 12,267,078 B2
(45) Date of Patent: Apr. 1, 2025

(54) SYNCHRONIZING DIGITAL DEVICE

(71) Applicant: STMICROELECTRONICS S.r.l., Agrate Brianza (IT)

(72) Inventors: Matteo Quartiroli, Certosa di Pavia (IT); Alessandro Mecchia, Vimercate (IT); Paolo Pesenti, Senago (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 0 days.

(21) Appl. No.: 18/352,581

(22) Filed: Jul. 14, 2023

(65) Prior Publication Data
US 2024/0048144 A1 Feb. 8, 2024

(30) Foreign Application Priority Data
Aug. 3, 2022 (IT) .................. 102022000016557

(51) Int. Cl.
*H03L 7/081* (2006.01)
*H03L 7/099* (2006.01)

(52) U.S. Cl.
CPC .......... *H03L 7/0814* (2013.01); *H03L 7/0992* (2013.01)

(58) Field of Classification Search
CPC .................................................. H03L 7/0814
USPC ....................................................... 327/156
See application file for complete search history.

(56) References Cited

U.S. PATENT DOCUMENTS

2009/0160564 A1* 6/2009 Cho ........................ H03L 7/093
331/1 A

FOREIGN PATENT DOCUMENTS

WO WO 9508220 A1 3/1995
WO WO 9713325 A1 4/1997

OTHER PUBLICATIONS

Urbansky et al., "A Novel Slave-Clock Implementation Approach for Telecommunications Network Synchronisation," European Frequency Time Forum, Mar. 5-7, 1996, Conference Publication No. 418 IEE, pp. 534-539.

* cited by examiner

*Primary Examiner* — Tomi Skibinski
(74) *Attorney, Agent, or Firm* — Seed IP Law Group LLP

(57) ABSTRACT

A device includes a local oscillator, an all-digital phase-locked loop, a digital signal generator, sampling circuitry, and an interface. The local oscillator generates a local clock signal. The all-digital phase locked loop generates a sampling control signal. The ADPLL includes a phase-error detector, a digital filter and a sigma-delta modulator. The phase detector generates a phase error signal based on a loop clock signal and a received reference signal. The digital filter generates a signal indicative of a frequency ratio between a frequency of the reference clock signal and the local clock frequency based on the phase error signal. The sigma-delta modulator generates a modulated signal based on the signal indicative of the frequency ratio. The sampling control signal is based on the modulated signal. The sampling circuitry samples digital signals generated by the digital signal generator at a sampling frequency, which is a function of the sampling control signal.

21 Claims, 2 Drawing Sheets

SYNCHRONIZING DIGITAL DEVICE

BACKGROUND

Technical Field

The present disclosure relates to a synchronizing digital device.

Description of the Related Art

As is known, many electronic systems include a plurality of devices which operate at respective distinct clock frequencies, but need to communicate with each other or with a central device through a same line using a global clock. For example, it is by now common to equip portable apparatuses such as smartphones, tablets and laptop computers with inertial sensors, in particular accelerometers and gyroscopes, and with other sensors, such as temperature sensors and pressure sensors, in order to extend the available functionalities. The sensors are normally connected to a central control unit, which acts as a system master, through a bus. The bus operates at a master clock frequency set for example by the control unit, while the sensors, which communicate in slave mode, each generate data with a respective native generation rate determined, inter alia, by an internal clock frequency. However, the native generation rates are generally different from each other and from the master clock frequency.

In general, in order for the data to be exchanged between a master device and slave devices through a common line, generated data need to be synchronized with the master clock frequency, as occurs for example in systems based on Time Division Multiplexing (TDM). TDM interfaces allow the transmission of different data channels on a single line, but they are not standardized and data to be transmitted are generated in an asynchronous manner with respect to the master clock.

Different measures may be used to obtain the synchronization, but known solutions have some limitations and may not be satisfactory.

In accordance with a first known solution, a high-frequency master clock signal is sent to all slave devices and in practice replaces the clock signals generated by the local oscillators. The solution is robust, but represents a complication from the construction point of view, because it is necessary to add a high-frequency line to the system, and the power consumption increases in a non-negligible manner. This aspect is particularly unwanted, because it may limit the autonomy of the portable apparatuses. Furthermore, the solution cannot be applied to all devices, for example some multiaxial gyroscopes.

According to a different solution, a resampling is carried out within the slave devices using "slow" signals of the data bus as a basis. Also in this case, however, there are some limitations. Firstly, it is necessary to provide for a conversion chain with frequency multiplication, interpolation, decimation, without however always being able to obtain the desired frequency with precision. Therefore, in the face of an increase in circuit complexity, the result may not be optimal. Furthermore, the conversion and resampling operations introduce noise in the form of spectral peaks that may degrade the signal.

BRIEF SUMMARY

In an embodiment, a device includes a local oscillator, an all-digital phase-locked loop (ADPLL), digital signal generating circuitry, sampling circuitry and an interface. The local oscillator generates a local clock signal having a local clock frequency. The all-digital phase locked loop generates a sampling control signal. The ADPLL includes a phase-error detector, a digital filter and a sigma-delta modulator. The phase detector generates a phase error signal based on a loop clock signal and a received reference signal. The digital filter generates a signal indicative of a frequency ratio between a frequency of the reference clock signal and the local clock frequency based on the phase error signal. The sigma-delta modulator generates a modulated signal based on the signal indicative of the frequency ratio generated by the digital filter. The sampling control signal is based on the modulated signal. The digital signal generating circuitry is coupled to the local oscillator and generates digital signals. The sampling circuitry samples the digital signals at a sampling frequency which is a function of the sampling control signal. The interface outputs sampled data signals.

In an embodiment, a system comprises a master device, a bus system coupled to the master device, and a slave device. The bus system has a bus clock signal having a bus clock frequency. The slave device is coupled to the bus system. The slave device includes a local oscillator, an all-digital phase locked loop (ADPLL), digital signal generating circuitry, sampling circuitry and an interface. The local oscillator, in operation, generates a local clock signal having a local clock frequency. The ADPLL is coupled to the local oscillator, and in operation, generates a sampling control signal. The ADPLL includes a phase-error detector, a digital filter, and a sigma-delta modulator. The phase-error detector, in operation, generates a phase error signal based on a loop clock signal and the bus clock signal. The digital filter is coupled to the phase-error detector, and, in operation, generates a signal indicative of a frequency ratio between a frequency of the bus clock signal and the local clock frequency based on the phase error signal. The sigma-delta modulator is coupled to the digital filter, and, in operation, generates a modulated signal based on the signal indicative of the frequency ratio generated by the digital filter. The sampling control signal is based on the modulated signal. The digital signal generating circuitry is coupled to the local oscillator, and, in operation, generates digital signals. The sampling circuitry is coupled to the digital signal generating circuitry and to the ADPLL. The sampling circuitry, in operation, samples digital signals generated by the digital signal generating circuitry at a sampling frequency which is a function of the sampling control signal. The interface is coupled to the sampling circuitry and to the bus system. In operation, the interface outputs sampled data signals.

In an embodiment, a method comprises: generating, using a local clock of a slave device, a local clock signal having a local clock frequency; generating digital signals using the local clock signal; generating, using an all-digital phase locked loop (ADPLL) coupled to the local oscillator, a sampling control signal; sampling the generated digital signals at a sampling frequency which is a function of the sampling control signal; and generating an output of the slave device based on the sampled digital signals. The generating the sampling control signal comprises: generating a phase error signal based on a loop clock signal and a reference clock signal; generating a signal indicative of a frequency ratio between a frequency of the reference clock signal and the local clock frequency based on the phase error signal; and generating, using a sigma-delta modulator, a modulated signal based on the signal indicative of the frequency ratio; and generating the sampling control signal based on the modulated signal.

BRIEF DESCRIPTION OF THE SEVERAL VIEWS OF THE DRAWINGS

For a better understanding of the disclosure, an embodiment thereof will now be described, purely by way of non-limiting example and with reference to the attached drawings, wherein.

DETAILED DESCRIPTION

Figure 1:
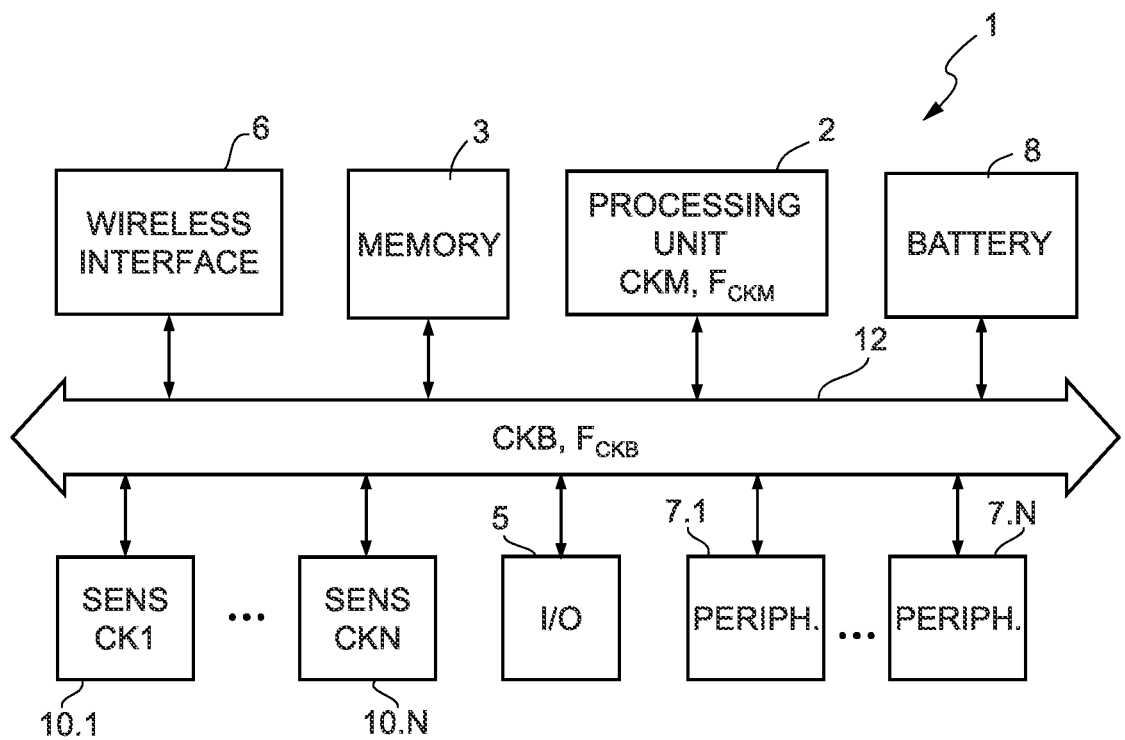
FIG. 1 is a simplified block diagram of an electronic system.

With reference to FIG. 1, an electronic system is indicated as a whole with the number 1 and may be an electronic system of any type, in particular, but not limited to, a wearable device, such as a watch, a bracelet or a smart band; a computer, such as a mainframe, a personal computer, a laptop or a tablet; a smartphone; a digital music player, a digital camera or any other device for processing, storing, transmitting or receiving information. The electronic system 1 may be a general purpose or device-embedded processing system, an equipment or a further system.

The electronic system 1 may comprise a processing unit 2, memory devices 3, input/output (I/O) devices 5 (for example a keyboard, a pointer or a touch screen), a wireless interface 6, peripherals 7.1, . . . , 7.N, a battery 8 and possibly further auxiliary devices, not shown here. The processing unit 2 may comprise, for example, one or more microprocessors, microcontrollers and the like, according to design preferences.

Furthermore, the electronic system 1 may comprise one or more sensors 10.1, . . . , 10.N, for example accelerometers, gyroscopes, pressure sensors, temperature sensors, humidity sensors. The sensors 10.1, . . . , 10.N may be of microelectromechanical type.

It is to be noted that the scope of the present disclosure is not limited to embodiments necessarily having one or all of the devices listed.

The components of the electronic system 1 may be coupled in communication with each other and in particular to the processing unit 2 through a system bus 12, which is global as in the example of FIG. 1, or through local buses dedicated to groups of devices, for example the sensors . . . , 10.N, or various combinations thereof. One of the components, normally the processing unit 2, acts as a master and the other components, for example the sensors 10.1, . . . , 10.N, are coupled in communication through the system bus 12 in slave mode.

At least some of the slave devices of the system 1 (FIG. 2), including for example the sensors 10.1, . . . , 10.N, are configured to provide data based on local oscillators with respective local clock frequencies $F_{CK1}, \ldots, F_{CKN}$ asynchronous to each other and asynchronous with respect to a bus clock frequency $F_{CKB}$ of the bus 12. The bus clock frequency $F_{CKB}$ of the bus 12 may for example be set by the processing unit 2, which acts as a master, and may be determined on the basis of a master clock frequency $F_{CKM}$ of the same processing unit 2 (typically, the master clock frequency $F_{CKM}$ is an integer multiple of the bus clock frequency $F_{CKB}$).

Figure 2:
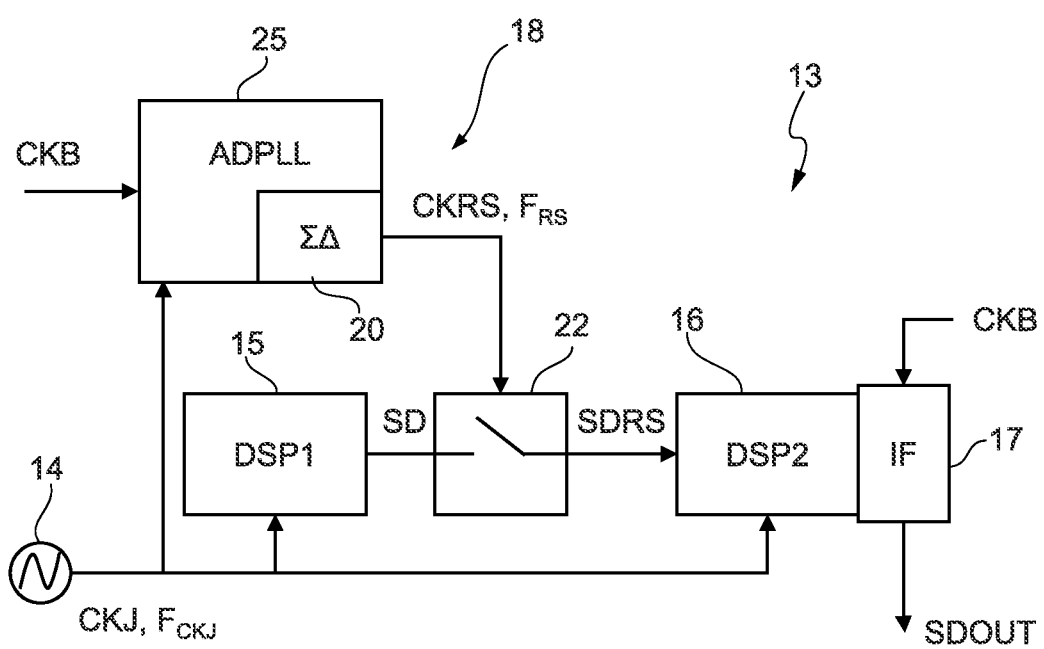
FIG. 2 is a block diagram of a synchronizing digital device according to an embodiment of the present disclosure incorporated in the system of FIG. 1.

FIG. 2 illustrates a simplified block diagram of one of the slave devices, here indicated with 13. The slave device 13 may be for example one of the sensors 10.1, . . . , 10.N and operates on the basis of a local clock frequency $F_{CKJ}$. The case is illustrated by way of non-limiting example and it is understood that the synchronization technique described below may be used in devices of any type, not only with microelectromechanical sensors or with any other of the devices of the system 1.

The slave device 13 is a synchronizing digital device according to an embodiment of the present disclosure and comprises a local oscillator 14, a first processing stage 15, a second processing stage 16, an interface 17 and a synchronization stage 18.

The oscillator 14 produces a local clock signal CKJ which has the local clock frequency $F_{CKJ}$ and is used to time the other components of the slave device 13. For the sake of simplicity, the Figures show that the local clock signal CKJ is sent to all components of the slave device 13. It is however understood that each component may be timed with a respective clock signal obtained from the local clock signal CKJ, but not necessarily equal. The clock signal of each component may be defined according to design preferences and is, normally, obtained from the local clock signal CKJ by frequency division according to an integer number.

The first processing stage 15 provides digital signals SD and may comprise or interact with a microelectromechanical structure (for example in the case of microelectromechanical inertial sensors), accomplishing generic functions provided for the correct operation of the slave device 13. For example, in a microelectromechanical gyroscope the first processing stage 15 may include a microstructure, actuation circuits to drive the microstructure, an analog-to-digital converter, a conversion chain to transduce movements of the microstructure correlated to a quantity to be sensed into usable electrical quantities. Alternatively, the first processing stage may be purely digital and may be provided with an interface coupled with the microstructure to receive sensing signals. The first processing stage 15 may include a DSP (Digital Signal Processor), as illustrated DSP1. The functionalities implemented by the first processing stage 15 are however determined on the basis of design preferences.

The second processing stage 16, if any, may perform further processing steps downstream of the intervention of the synchronization stage 18. The second processing stage 16 may also include a DSP, as illustrated DSP2.

The interface 17 is coupled to the second processing stage 16 and to the system bus 12. In particular, the interface 17 is controlled by one or more bus clock signals CKB based on the bus clock frequency $F_{CKB}$ and makes available samples of output signals SOUT for the transmission through the system bus 12.

In one embodiment, the synchronization stage 18 is based on a multi-bit sigma-delta modulator 20 and comprises, in addiction, a reference input and a resampler stage 22 controlled by the sigma-delta modulator 20 which is included in an All Digital Phase Locked Loop (ADPLL), as explained in detail hereinbelow. The resampler 22 is arranged between the first processing stage 15 and the second processing stage 16 or, in case the second processing stage is not present, directly between the first processing stage 15 and the interface 17. In practice, the resampler 22 makes available resampled digital signals SDRS to the second processing stage 16. The resampled digital signals SDRS are obtained by taking samples of the digital signals SD supplied by the first processing stage 15 with a resampling frequency $F_{RS}$ and a resampling phase $\varphi_{RS}$ determined by the sigma-delta modulator 20 in a manner synchronized with the bus clock frequency $F_{CKB}$ of the bus clock signal CKB.

The reference input of the synchronization stage 18 is configured to be connected to the system bus 12 and receive the bus clock signal CKB based on the bus clock frequency $F_{CKB}$.

The sigma-delta modulator 20 controls the resampler 22 through a resampling signal SRS as a function of the bus clock signal CKB and modulates the resampling phase $\varphi_{RS}$ so that, on average, the resampling frequency $F_{RS}$ coincides with the bus clock frequency $F_{CKB}$. In practice, the oversampling carried out by the sigma-delta modulator 20 allows, on the one hand, the resampling instants to be selected through the resampler 22 and the bus clock frequency $F_{CKB}$ to be tracked and, on the other hand, the sampling noise to be shifted to high frequency due to the noise shaping effect associated with the sigma-delta modulators. The high-frequency noise may thus be effectively filtered, avoiding aliasing phenomena in the bandwidth of the digital signal SD provided by the first processing stage 15. Other advantages depend on the very simple structure of the sigma-delta modulators, which allows manufacturing costs to be reduced, without the need for precision analog circuits and without affecting the performances. Furthermore, the slave device 13 uses a single clock signal generated internally as the basis for the timing of all components. The bus clock signal CKB is used solely as a reference for the sigma-delta modulator, but it is not necessary for timing the components of the slave device 13.

Figure 3:
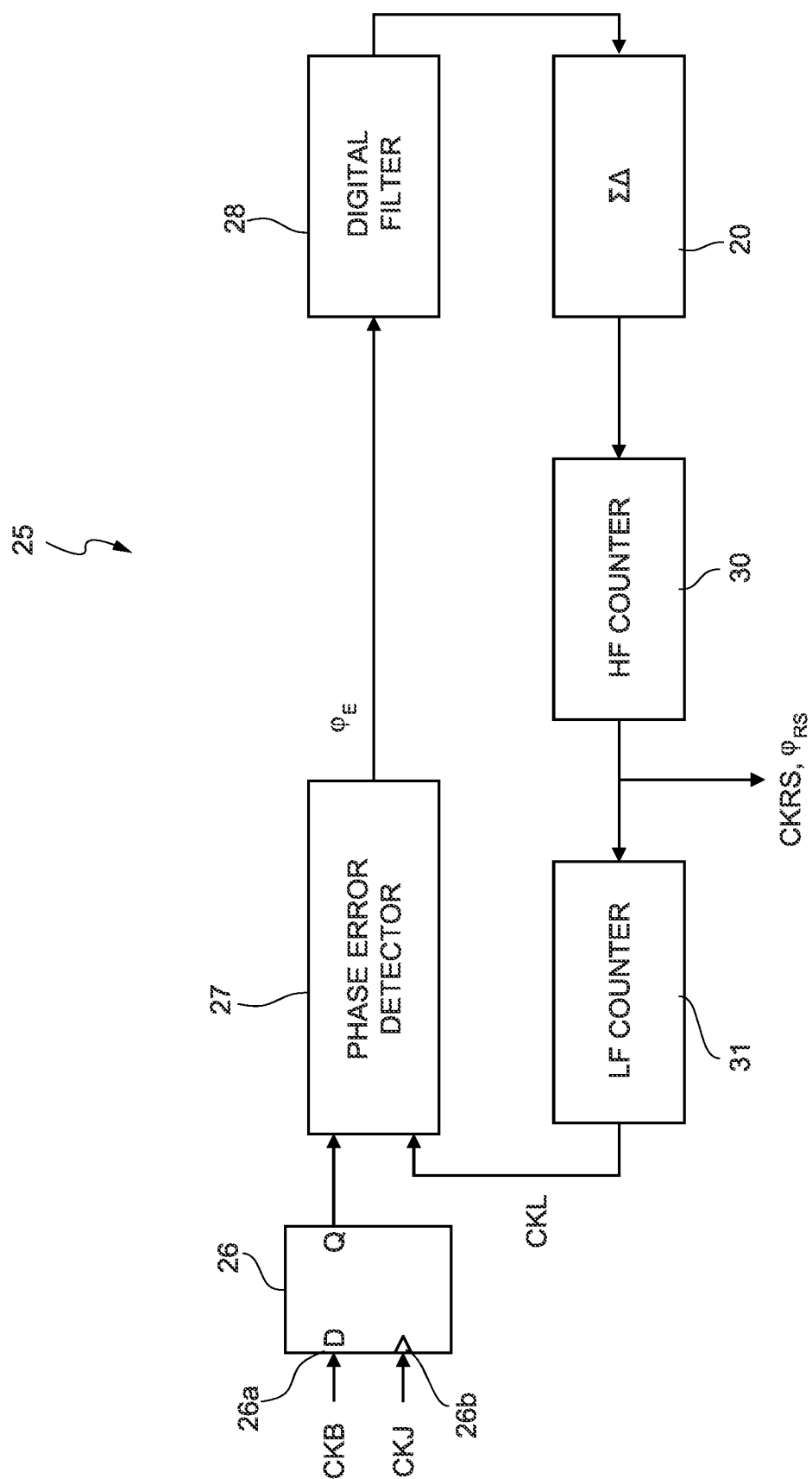
FIG. 3 is a more detailed block diagram of a part of the synchronizing digital device of FIG. 2.

To obtain the correct ratio between the bus clock frequency $F_{CKB}$ and the resampling frequency $F_{RS}$ by operating in the domain of the local clock frequency $F_{CKJ}$, the sigma-delta modulator 20 is included in an all-digital phase locked loop 25, as shown schematically in FIG. 2 and in more detail in FIG. 3. The all-digital phase locked loop 25 uses the bus clock signal CKB as a reference and in one embodiment comprises a resynchronizer 26, a phase error detector 27, a digital filter 28, the sigma-delta modulator 20, a first counter 30 and a second counter 31.

The resynchronizer 26 receives the bus clock signal CKB at input and is configured to make available the values of the bus clock signal CKB at the local clock frequency $F_{CKJ}$. In one embodiment, the resynchronizer 26 comprises a D-type flip-flop which receives the bus clock signal CKB on a data input 26a and the local clock signal CKJ, or a clock signal obtained from the local clock signal CKJ for example through a frequency divider (not shown), on a clock input 26b. The data input 26a defines the reference input of the synchronization stage 18. In some embodiments, the resynchronization stage may be missing.

The phase error detector 27 receives the samples of the bus clock signal CKB output from the resynchronizer 26 and, in addition, a loop clock signal CKL from the second counter 31. The phase error detector 27 determines a phase error $\varphi_E$ between the samples of the bus clock signal CKB and the loop clock signal CKL.

Based on the phase error $\varphi_E$ from the phase error detector 27 provided by the phase error detector 27, the digital filter 28 determines a signal indicative of a frequency ratio R between the bus clock frequency $F_{CKB}$ and the local clock frequency $F_{CKJ}$ of the local clock signal CKJ to be set to synchronize the slave device 13 to the system bus 12. In an embodiment, for example, the digital filter 28 may implement a proportional-integral controller.

The sigma-delta modulator 20 converts the frequency ratio R into a relatively high-frequency and low-resolution signal that defines an approximating frequency ratio R'. The approximating frequency ratio R' represents in practice an integer that approximates the actual frequency ratio R, is updated to the work frequency of the sigma-delta modulator 20 and oscillates around the actual frequency ratio R. The approximating frequency ratio R' follows on average very precisely the actual frequency ratio R, also owing to the work frequency of the sigma-delta modulator 20, which is higher with respect to the frequency of the other signals in the all-digital phase locked loop 25.

The approximating frequency ratio R' is provided to the first counter 30 and defines a variable count limit to generate the resampling signal CKRS with modulated frequency which is on average equal to the bus clock frequency $F_{CKB}$. The first counter 30 is a high-frequency counter and uses the highest frequency clock signal available within the slave device 13, the local clock signal CKJ.

The resampling signal CKRS is used to both request the sigma-delta modulator 20 an updated value of the approximating frequency ratio R' and control the resampler 22. In practice, the first counter 30 provides the resampling signal CKRS to the sigma-delta modulator 20 through the second counter 31, the phase error detector 27 and the digital filter 28 and the sigma-delta modulator 20 provides an updated value of the approximating frequency ratio R' to the first counter 30 in response to transitions of the resampling signal CKRS.

The resampling signal CKRS controls the resampler 22 so that the second processing stage 16 takes the value of a sample present on the output of the first processing stage 15 with resampling frequency $F_{RS}$ and resampling phase $\varphi_{RS}$ which, on average, accurately approximate the bus clock frequency $F_{CKB}$ and its phase $\varphi_B$. More precisely, the high count frequency of the first counter 20 and the update rate of the sigma-delta modulator 20 allow obtaining a number of samples sufficiently high so that the averages of the resampling frequency $F_{RS}$ and of the resampling phase $\varphi_{RS}$ are effectively close to the bus clock frequency $F_{CKB}$ and its phase $\varphi_B$.

Furthermore, the resampling signal CKRS is provided to the second counter 31, which generates the loop clock signal CKL. The second counter 31 may be for example a fixed count module counter and may operate with a clock signal at a lower frequency with respect to the first counter 30. The count module is defined so that the loop clock signal CKL has a frequency resulting close to the bus clock frequency $F_{CKB}$ of the bus clock signal CKB, to allow the phase locking. The second counter 31 may be a dedicated component included in the all-digital phase locked loop 25 or a shared component, already present for example in the second processing stage 16.

An embodiment advantageously facilitates using only clock signals internal to the slave devices to obtain synchronization with an external clock signal, in particular of a system bus wherewith the slave devices need to communicate. In fact, the resampling process and the subsequent processing steps occur in the same clock domain as the data generation. In other words, except for the bus frequency reference to be locked, all the clock signals used for signal processing and for the resampling process may be obtained from the same local clock signal. The same performances may also be obtained by using clock frequencies which are on average lower, also to the advantage of consumption reduction and greater autonomy for portable devices.

For the implementation of communication schemes based on time division multiplexing, for example, the bus clock signals (bit clock signals, word clock signals) are used only for data extraction through the interface 17.

The use of the phase-locked loop facilitates, once the phase locking is achieved, that the resampling of the signals provided by the first processing stage is performed without asynchronies. Furthermore, the frequency response of a phase-locked loop generally follows the model of a low-pass filter and allows eliminating or reducing the quantization noise of the sigma-delta modulator, which, due to the noise shaping effect, is mainly shifted to high frequency. The fact that the sigma-delta modulator is included in the phase-locked loop therefore entails a further important advantage.

Furthermore, an embodiment of the solution proposed according to the disclosure is completely digital and has no impact on the analog blocks present in the slave devices.

Finally, it is clear that modifications and variations may be made to the device described, without departing from the scope of the present disclosure, as defined in the attached claims.

A synchronizing digital device may be summarized as including a reference input (26a) configured to receive a reference clock signal (CKB), having a reference clock frequency ($F_{CKB}$); an output (17); a local oscillator (14), providing a local clock signal (CKJ) having a local clock frequency ($F_{CKJ}$); a digital signal source (15), based on the local clock signal (CKJ) and providing digital signals (SD); and a synchronization stage (18), based on the local clock signal (CKJ) and including a resampler (22), arranged between the digital signal source (15) and the output (17) and configured to make available resampled digital signals (SDRS), obtained by taking samples of the digital signals (SD) with a resampling frequency ($F_{RS}$); and a sigma-delta modulator (20) configured to cause the generation of a resampling signal (CKF) modulated on average at the resampling frequency ($F_{RS}$) as a function of the reference clock signal (CKB) and to control the resampler (22) through the resampling signal (CKF).

The synchronization stage (18) may include an all-digital phase locked loop (25), receiving the reference clock signal (CKB) and including the sigma-delta modulator (20).

The all-digital phase locked loop (25) may include a phase error detector (27) receiving the reference clock signal (CKB) and a loop clock signal (CKL) obtained from the resampling signal (CKRS) and configured to generate a phase error signal ($\varphi_E$) based on the reference clock signal (CKB) and the loop clock signal (CKL).

The all-digital phase locked loop (25) may include a digital filter (28), configured to generate a frequency ratio (R) indicative of a ratio between the bus clock frequency ($F_{CKB}$) and the local clock frequency ($F_{CKJ}$) of the local clock signal (CKJ) on the basis of the phase error signal ($\varphi_E$).

The sigma-delta modulator (20) may be a multi-bit modulator configured to generate an approximating frequency ratio (R') from the frequency ratio (R), so that the approximating frequency ratio (R') is on average equal to the frequency ratio (R).

The all-digital phase locked loop (25) may include a first counter (30) coupled to the sigma-delta modulator (20) to receive the approximating frequency ratio (R'), wherein the approximating frequency ratio (R') may define a variable count limit for the first counter (30).

The first counter (30) may be configured to generate the resampling signal (CKF) as a function of the approximating frequency ratio (R').

The first counter (30) may be a high-frequency counter based on a clock signal at maximum available frequency.

The first counter (30) may be configured to control the resampler (22) by the resampling signal (CKRS).

The first counter (30) may be configured to provide the resampling signal (CKRS) to the sigma-delta modulator (20) and the sigma-delta modulator (20) may be configured to provide an updated value of the approximating frequency ratio (R') to the first counter (30) in response to transitions of the resampling signal (CKRS).

The all-digital phase locked loop (25) may include a second counter (31) coupled to the first counter (30) to receive the resampling signal (CKRS) and configured to generate the loop clock signal (CKL) at a loop clock frequency ($F_{CKL}$) lower than the resampling frequency ($F_{RS}$).

The second counter (31) may be coupled to the phase error detector (27) to provide the loop clock signal (CKL).

The device may include a resynchronizer (26) configured to receive the reference clock signal (CKB) and configured to make available values of the reference clock signal (CKB) at the local clock frequency ($F_{CKJ}$) or at frequency obtained from the local clock frequency ($F_{CKJ}$).

The device may include a digital processing stage (16) arranged between the resampler (22) and the output (17) and configured to receive the resampled digital signals (SDRS) from the resampler (22).

An electronic system may be summarized as including a master device (2), a bus (12) and at least one synchronizing digital device (10.1, . . . , 10.N; 13), configured to communicate with the master device (2) in slave mode through the bus (12); wherein the reference clock signal (CKB) is defined by a bus clock signal of the bus (12).

In an embodiment, a device includes a local oscillator, an all-digital phase-locked loop, digital signal generating circuitry, sampling circuitry and an interface. The local oscillator generates a local clock signal having a local clock frequency. The all-digital phase locked loop generates a sampling control signal. The ADPLL includes a phase-error detector, a digital filter and a sigma-delta modulator. The phase detector generates a phase error signal based on a loop clock signal and a received reference signal. The digital filter generates a signal indicative of a frequency ratio between a frequency of the reference clock signal and the local clock frequency based on the phase error signal. The sigma-delta modulator generates a modulated signal based on the signal indicative of the frequency ratio generated by the digital filter. The sampling control signal is based on the modulated signal. The digital signal generating circuitry is coupled to the local oscillator and generates digital signals. The sampling circuitry samples the digital signals at a sampling frequency which is a function of the sampling control signal. The interface outputs sampled data signals.

In an embodiment, the sigma-delta modulator is a multi-bit modulator, and the modulated signal is an approximating frequency ratio signal on average equal to the frequency ratio. In an embodiment, the ADPLL comprises a first counter coupled to the sigma-delta modulator, wherein the first counter, in operation, receives the modulated signal, and the modulated signal defines a variable count limit of the first counter. In an embodiment, the first counter, in operation, generates the sampling control signal as a function of the modulated signal. In an embodiment, the first counter is a high-frequency counter. In an embodiment, the sampling control signal is a feedback signal of the ADPLL, and the sigma-delta modulator, in operation, updates the modulated signal as a function of transitions of the sampling control signal. In an embodiment, the ADPLL comprises a second counter coupled to the first counter, wherein the second counter, in operation, receives the sampling control signal and generates the loop clock signal at a loop clock frequency lower than the sampling frequency. In an embodiment, the second counter is coupled to the phase error detector, and the phase detector, in operation, receives the loop clock signal. In an embodiment, the device comprises a synchronizer, which, in operation, receives the reference clock signal and the local clock signal and outputs values of the reference clock signal at the local clock frequency. In an embodiment, the device comprises digital signal processing circuitry coupled between the sampling circuitry and the interface. In an embodiment, the digital signal generating circuitry comprises a sensor, which, in operation, generates sensor data, and the digital signal processing circuitry, in operation, generates the digital signals based on the sensor data. In an embodiment, the digital signal generating circuitry comprises a microelectromechanical device and a digital signal processor.

In an embodiment, a system comprises a master device, a bus system coupled to the master device, and a slave device. The bus system has a bus clock signal having a bus clock frequency. The slave device is coupled to the bus system. The slave device includes a local oscillator, an all-digital phase locked loop (ADPLL), digital signal generating circuitry, sampling circuitry and an interface. The local oscillator, in operation, generates a local clock signal having a local clock frequency. The ADPLL is coupled to the local oscillator, and in operation, generates a sampling control signal. The ADPLL includes a phase-error detector, a digital filter, and a sigma-delta modulator. The phase-error detector, in operation, generates a phase error signal based on a loop clock signal and the bus clock signal. The digital filter is coupled to the phase-error detector, and, in operation, generates a signal indicative of a frequency ratio between a frequency of the bus clock signal and the local clock frequency based on the phase error signal. The sigma-delta modulator is coupled to the digital filter, and, in operation, generates a modulated signal based on the signal indicative of the frequency ratio generated by the digital filter. The sampling control signal is based on the modulated signal. The digital signal generating circuitry is coupled to the local oscillator, and, in operation, generates digital signals. The sampling circuitry is coupled to the digital signal generating circuitry and to the ADPLL. The sampling circuitry, in operation, samples digital signals generated by the digital signal generating circuitry at a sampling frequency which is a function of the sampling control signal. The interface is coupled to the sampling circuitry and to the bus system. In operation, the interface outputs sampled data signals.

In an embodiment, the sigma-delta modulator is a multi-bit modulator. In an embodiment, the sampling control signal is a feedback signal of the ADPLL, and the sigma-delta modulator, in operation, updates the modulated signal as a function of transitions of the sampling control signal. In an embodiment, the slave device is a microelectromechanical sensor device and master device is a host processor. In an embodiment, the system comprises a second slave device coupled to the bus system.

In an embodiment, a method comprises: generating, using a local clock of a slave device, a local clock signal having a local clock frequency; generating digital signals using the local clock signal; generating, using an all-digital phase locked loop (ADPLL) coupled to the local oscillator, a sampling control signal; sampling the generated digital signals at a sampling frequency which is a function of the sampling control signal; and generating an output of the slave device based on the sampled digital signals. The generating the sampling control signal comprises: generating a phase error signal based on a loop clock signal and a reference clock signal; generating a signal indicative of a frequency ratio between a frequency of the reference clock signal and the local clock frequency based on the phase error signal; and generating, using a sigma-delta modulator, a modulated signal based on the signal indicative of the frequency ratio; and generating the sampling control signal based on the modulated signal. In an embodiment, the sigma-delta modulator is a multi-bit modulator. In an embodiment, the sampling control signal is a feedback signal of the ADPLL. In an embodiment, the slave device is a microelectromechanical sensor device and the reference clock is a bus system clock, wherein the generating digital signals comprises using the local clock signal to sample sensor signals.

Some embodiments may take the form of or comprise computer program products. For example, according to one embodiment there is provided a computer readable medium comprising a computer program adapted to perform one or more of the methods or functions described above. The medium may be a physical storage medium, such as for example a Read Only Memory (ROM) chip, or a disk such as a Digital Versatile Disk (DVD-ROM), Compact Disk (CD-ROM), a hard disk, a memory, a network, or a portable media article to be read by an appropriate drive or via an appropriate connection, including as encoded in one or more barcodes or other related codes stored on one or more such computer-readable mediums and being readable by an appropriate reader device.

Furthermore, in some embodiments, some or all of the methods and/or functionality may be implemented or provided in other manners, such as at least partially in firmware and/or hardware, including, but not limited to, one or more application-specific integrated circuits (ASICs), digital signal processors, discrete circuitry, logic gates, standard integrated circuits, controllers (e.g., by executing appropriate instructions, and including microcontrollers and/or embedded controllers), field-programmable gate arrays (FPGAs), complex programmable logic devices (CPLDs), etc., as well as devices that employ RFID technology, and various combinations thereof.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:
1. A device, comprising:
 a local oscillator, which, in operation, generates a local clock signal having a local clock frequency;
 an all-digital phase locked loop (ADPLL) coupled to the local oscillator, wherein ADPLL, in operation, generates a sampling control signal, the ADPLL including:
  a phase-error detector, which, in operation, generates a phase error signal based on a loop clock signal and a received reference signal;
  a digital filter coupled to the phase-error detector, wherein the digital filter, in operation, generates a signal indicative of a frequency ratio between a frequency of the reference clock signal and the local clock frequency based on the phase error signal; and a sigma-delta modulator coupled to the digital filter, wherein the sigma-delta modulator, in operation, generates a modulated signal based on the signal indicative of the frequency ratio generated by the digital filter, and the sampling control signal is based on the modulated signal;

digital signal generating circuitry coupled to the local oscillator, wherein the digital signal generating circuitry, in operation, generates digital signals;

sampling circuitry, coupled to the digital signal generating circuitry and to the ADPLL, wherein the sampling circuitry, in operation, samples digital signals generated by the digital signal generating circuitry at a sampling frequency which is a function of the sampling control signal; and an interface coupled to the sampling circuitry, wherein the interface, in operation, outputs sampled data signals.

2. The device according to claim 1, wherein the sigma-delta modulator is a multi-bit modulator, and the modulated signal is an approximating frequency ratio signal on average equal to the frequency ratio.

3. The device according to claim 1, wherein the ADPLL comprises a first counter coupled to the sigma-delta modulator, wherein the first counter, in operation, receives the modulated signal, and the modulated signal defines a variable count limit of the first counter.

4. The device according to claim 3, wherein the first counter, in operation, generates the sampling control signal as a function of the modulated signal.

5. The device according to claim 3, wherein the first counter is a high-frequency counter.

6. The device according to claim 3, wherein the sampling control signal is a feedback signal of the ADPLL, and the sigma-delta modulator, in operation, updates the modulated signal as a function of transitions of the sampling control signal.

7. The device according to claim 6, wherein the ADPLL comprises a second counter coupled to the first counter, wherein the second counter, in operation, receives the sampling control signal and generates the loop clock signal at a loop clock frequency lower than the sampling frequency.

8. The device according to claim 7, wherein the second counter is coupled to the phase error detector, and the phase detector, in operation, receives the loop clock signal.

9. The device according to claim 1, comprising a synchronizer, which, in operation, receives the reference clock signal and the local clock signal and outputs values of the reference clock signal at the local clock frequency.

10. The device according to claim 1, comprising digital signal processing circuitry coupled between the sampling circuitry and the interface.

11. The device according to claim 1, wherein the digital signal generating circuitry comprises a sensor, which, in operation, generates sensor data, and the digital signal processing circuitry, in operation, generates the digital signals based on the sensor data.

12. The device according to claim 1, wherein the digital signal generating circuitry comprises a microelectromechanical device and a digital signal processor.

13. A system, comprising:
a master device;
a bus system coupled to the master device, wherein the bus system has a bus clock signal having a bus clock frequency; and
a slave device coupled to the bus system, the slave device including:

a local oscillator, which, in operation, generates a local clock signal having a local clock frequency;
an all-digital phase locked loop (ADPLL) coupled to the local oscillator, wherein ADPLL, in operation, generates a sampling control signal, the ADPLL including:
a phase-error detector, which, in operation, generates a phase error signal based on a loop clock signal and the bus clock signal;
a digital filter coupled to the phase-error detector, wherein the digital filter, in operation, generates a signal indicative of a frequency ratio between a frequency of the bus clock signal and the local clock frequency based on the phase error signal; and
a sigma-delta modulator coupled to the digital filter, wherein the sigma-delta modulator, in operation, generates a modulated signal based on the signal indicative of the frequency ratio generated by the digital filter, and the sampling control signal is based on the modulated signal;
digital signal generating circuitry coupled to the local oscillator, wherein the digital signal generating circuitry, in operation, generates digital signals;
sampling circuitry, coupled to the digital signal generating circuitry and to the ADPLL, wherein the sampling circuitry, in operation, samples digital signals generated by the digital signal generating circuitry at a sampling frequency which is a function of the sampling control signal; and
an interface coupled to the sampling circuitry and to the bus system, wherein the interface, in operation, outputs sampled data signals.

14. The system according to claim 13, wherein the sigma-delta modulator is a multi-bit modulator.

15. The system according to claim 14, wherein the sampling control signal is a feedback signal of the ADPLL, and the sigma-delta modulator, in operation, updates the modulated signal as a function of transitions of the sampling control signal.

16. The system according to claim 13, wherein the slave device is a microelectromechanical sensor device and master device is a host processor.

17. The system according to claim 13, comprising a second slave device coupled to the bus system.

18. A method, comprising:
generating, using a local oscillator of a slave device, a local clock signal having a local clock frequency;
generating digital signals using the local clock signal;
generating, using an all-digital phase locked loop (ADPLL) coupled to the local oscillator, a sampling control signal;
sampling the generated digital signals at a sampling frequency which is a function of the sampling control signal; and
generating an output of the slave device based on the sampled digital signals, wherein the generating the sampling control signal comprises:
generating a phase error signal based on a loop clock signal and a reference clock signal;
generating a signal indicative of a frequency ratio between a frequency of the reference clock signal and the local clock frequency based on the phase error signal; and
generating, using a sigma-delta modulator, a modulated signal based on the signal indicative of the frequency ratio; and generating the sampling control signal based on the modulated signal.

19. The method according to claim 18, wherein the sigma-delta modulator is a multi-bit modulator.

20. The method of claim 18, wherein the sampling control signal is a feedback signal of the ADPLL.

21. The method of claim 18, wherein the slave device is a microelectromechanical sensor device and the reference clock is a bus system clock, wherein the generating digital signals comprises using the local clock signal to sample sensor signals.

* * * * *